United States Patent [19]

Hiesinger

[11] 4,258,126
[45] Mar. 24, 1981

[54] HIGH RESOLUTION RECORDING MEDIUM AND METHOD FOR PRODUCING SAME

[75] Inventor: Leopold Hiesinger, Traunreut, Fed. Rep. of Germany

[73] Assignee: Dr. Johannes Heidenhain GmbH, Traunreut, Fed. Rep. of Germany

[21] Appl. No.: 4,943

[22] Filed: Jan. 19, 1979

Related U.S. Application Data

[62] Division of Ser. No. 859,941, Dec. 12, 1977, Pat. No. 4,151,321.

[30] Foreign Application Priority Data

Dec. 23, 1976 [DE] Fed. Rep. of Germany ....... 2658623

[51] Int. Cl.³ .............................................. G03C 5/00
[52] U.S. Cl. ................................... 430/324; 430/321; 430/390
[58] Field of Search ................ 96/36.1, 38.3; 428/432, 428/212; 430/321, 324, 323, 390

[56] References Cited

U.S. PATENT DOCUMENTS

| | | | |
|---|---|---|---|
| 3,521,961 | 7/1970 | Heidenhain et al. | 350/166 X |
| 3,824,100 | 7/1974 | Griest | 96/38.3 |
| 3,891,440 | 6/1975 | Gallaro et al. | 96/36.1 |
| 3,971,874 | 7/1976 | Ohta et al. | 428/432 |
| 4,019,905 | 4/1977 | Tomita et al. | 96/36.1 |
| 4,026,743 | 5/1977 | Berezin | 96/38.3 |
| 4,151,321 | 4/1979 | Hiesinger | 428/195 |

FOREIGN PATENT DOCUMENTS 902713 10/1955 Fed. Rep. of Germany.
697036 9/1953 United Kingdom.

OTHER PUBLICATIONS

IBM Technical Disclosure Bulletin, vol. 15, No. 5, Oct. 1972, Making Iron Oxide Mask.

*Primary Examiner*—George F. Lesmes
*Assistant Examiner*—E. Rollins Buffalow
*Attorney, Agent, or Firm*—Hume, Clement, Brinks, Willian & Olds, Ltd.

[57] ABSTRACT

A high resolution recording medium is provided which employs at least two layers of inorganic material which act as filters for two different colors of visible light. In one embodiment, microphoto lithography techniques are used to create microinterference filters in the desired patterns on a glass substrate. Recording media constructed according to this invention exhibit increased stability with respect to time and improved resistance to light and heat damage as compared with prior art recording media employing organic dyes.

27 Claims, 4 Drawing Figures

HIGH RESOLUTION RECORDING MEDIUM AND METHOD FOR PRODUCING SAME

This is a division of application Ser. No. 859,941, filed Dec. 12, 1977 now U.S. Pat. No. 4,151,321.

BACKGROUND OF THE INVENTION

The invention relates to a recording medium for the reproduction of patterns with high resolution. The invention is directed in this respect particularly to the recording of large quantities of data per square millimeter ($mm^2$). The invention moreover relates to a method for producing such recording media with high resolution patterns.

With the aid of microfilm techniques, large volumes of archives (libraries, drawings and other documents) may be stored in a very small space. The limits of microfilm reside in the resolution capacity of the image or of the recording films, that is, in the legibility of the recorded image following re-enlargement to approximately the dimensions of the original picture. One limit to the resolution of conventional microfilm is the result of the grain of the photographic emulsions used, which are typically 10 to 20 microns in diameter. In this connection, the resolution of photographic fine grain layers as indicated by the manufacturers does not provide a simple indication of the resolution of microfilm. The manufacturers measure resolution in lines per millimeter, that is, the finest reproduceable grid as determined photometrically. The photometer curve of such an exposed grid distinctly shows maxima and minima. However, substantially more distinct contrasts are required for microfilm legibility, and these contrasts should be in black and white as far as possible and not in shades of gray. For exact documentation more or less sharp edges are needed. This means that the resolution indicated by the film manufacturer is much greater than the actual resolution of conventional microfilm.

Moreover, microfilms known to the prior art also may exhibit instability with respect to time, heat and light. Due to the shrinkage of the gelatin emulsion, patterns recorded thereon may be distorted with time and the films themselves may be distorted by heat. In color films the color of recorded images is subject to fading when exposed to light.

Photo-sensitized layers made from high polymers known as photo-resists offer the potential of substantially higher resolution than that obtained with photographic fine grain layers. By exposure to actinic light or with electrodes or ions, the chemical structure of these resists may be modified. In particular such exposure may change the solubility of the photo resist in specific "developer solutions".

The methods of "microphoto lithography" are well known in the prior art and have been applied in optics for the production of precise structures, such as graduated plates and graduations (see German Pat. No. 902,713). Of late they also have been used in semi-conductor technology in the so-called planar method for the fabrication of micro circuits. Likewise, lengthy messages (such as the text of the Bible, or highly reduced messages of U.S. Presidents with regard to the moon flight, etc.) have been produced on chrome-plated glass supports, with the aid of said micro lithography.

SUMMARY OF THE INVENTION

A primary object of this invention is to provide a recording medium, as well as a method for the fabrication of such a recording medium, where the data content to be accommodated on a unit of surface unit is increased considerably, while at the same time, the aforementioned disadvantages of distortion, fading, and sensitivity to heat are reduced.

This object is accomplished with a recording medium according to the invention as claimed. The pattern to be reproduced, which may be an image such as a map, a printed page, or a binary code for technical purposes, is recorded in multiple colors. At least two filter layers for different wave length ranges of visible light are used for the recording. Preferably, these filter layers are formed of inorganic materials that are resistant to heat and light damage.

Summarizing briefly, this invention is directed to the reproduction of highly complex multi-colored features (as they exist, for example, in detailed multi-colored maps) in a precise microstructure. The invention makes use of the principle derived from the science of chromatics that a multicolored representation increases the data content per unit of surface by one dimension as compared with a unicolored (black-white) representation.

A conventional example of this principle is found in colored maps where a precise accommodation of large quantities of data is required and where legibility is decisively increased by the use of more than one color. That is why this invention is well adapted for the representation of a colored micro-map. However, the invention is not limited to representing colored micro-maps, but instead relates in general to recording media with details (bits) which are stressed with reference to each other by different color hues and/or different color saturation.

The use of color offers more than a physical expansion of the code used heretofore in the art; the physiological effect resulting from the use of multiple colors also should be taken into account in the application of the invention. The present invention makes feasible multicolor presentation of many technical pictorial representations for the first time. This multicolor presentation is both physiologically and psychologically effective in many applications.

In the past various methods of color representation have been attempted. Lippman tried to build color photographs with the aid of the colors of thin layers via the Eidophororic method for color television, and color photography utilizes organic dyes with limited "light fastness".

According to one embodiment of the invention, recorded colors are generated by the interference of light. This interference is generated by interference layers which are built from thin inorganic layers and are relatively stable in time and resistant to light and heat. Multicolored micro images may be constructed with such thin inorganic interference layers.

An alternate embodiment of the invention employs grainless thin layers which are colored to selectively absorb portions of the visible spectrum. The granule sizes of these layers are below 20 nanometers (nm). Even at a thousand-fold re-enlargement, they are "grainless".

One method is particularly appropriate for the production of the aforementioned recording media. This method is known under the designation "micro photo lithography" and its origin goes back to the beginnings of photography and the use of grainless photo varnishes. This method utilizes layers of a photo sensitive compound, such as a photo resist, which are chemically modified by exposure to ultraviolet light, fine electron beams (screen micro styluses) and/or X-ray radiation or an ion probe. The lower limit of resolution in these known methods of reproduction is at graduation thicknesses of approximately 0.5 micron.

This invention has been demonstrated in the production of approximately 100 colored micro maps (for example, page L 8140 "Traunstein", scale 1:50,000 of the topographic map of the Bavarian Land Surveying Office, Munich) which reproduce on a glass surface area of 3 mm. by 3 mm. in full color and high precision the information contained in an original 600 mm. by 600 mm. map. In addition, colored recording media of micro structures have been produced which, insofar as their durability (light fastness, temperature stability, color reproduction) is concerned, could not be realized according to prior art. The present invention records color with inorganic materials which are more stable than a large part of the colors present in nature.

BRIEF DESCRIPTION OF THE DRAWINGS

The following detailed description should be read with reference to the appended drawings, in which.

DETAILED DESCRIPTION

The following description describes in detail the individual steps of a method for the production of a recording medium. For reasons of illustration, reference is made to the appended drawings. It is assumed in this connection that a micro map is to be produced with a scale of 1:10,000,000, for example, which is produced from colored portions of individual maps with a scale of 1:50,000, corresponding to a reduction of 1:200. The micro map contains all the information of the original map in an area of $3 \times 3$ mm$^2$, and can be re-enlarged with clearly legible edges up to five times the original size, that is, at an enlargement factor of 1:1000.

It is to be assumed for the example described herein that first the light blue portions of the map (the lakes and streams) and dark blue portions (captions and depth lines) are to be produced according to the method of the invention. All of these features will be recorded in one color hue which is differentiated only by its saturation. In the printing process as such, this difference in saturation is produced by a screen used in conjunction with the light blue surfaces.

Blue color hue No. 17 of standard DIN 6164 is required for the reproduction and is determined by a filter layer of optical thickness 240 nm. The exact thickness somewhat depends on the reflecting surfaces used in conjunction with the filter layer.

The degree of saturation depends on the reflection/transparency of the reflecting layers adhering to the filter layer. They may be composed of very thin silver (Ag) layers or of alternating layers of high and low refraction materials. This will be elucidated in greater detail with reference to FIG. 1 and FIG. 2.

With the aid of an apparatus known as an "ionograph", a glass platelet in the form of a substrate and purified in a manner known to the prior art shall be provided with the desired pattern. For that purpose, the glass platelet is placed into the equipment. The apparatus itself contains cathodes of a material appropriate for producing reflecting layers; preferably, a silver (Ag) cathode is provided. The cathodes remain permanently under vacuum. Following the introduction of the glass platelet into the ionograph and the loading of the ionograph with purified argon gas, a 27 megacycle HF voltage of about 3,000 volts is applied at a vacuum pressure of about 1 Pa, via a high performance capacitor having only a few ohms of capacitive resistance at a frequency of 27 megacycles, but which is extremely highly resistant for DC voltage. This voltage ignites a plasma. The electrons which, during the positive semi-wave of the high frequency, charge the silver cathode negatively are recombined by the argon ions during the negative semi-wave only to a small degree. In this manner, the Ag cathode remains charged negatively, and the accelerated Ag ions atomize the silver and generate a durable, grainless silver mirror on the glass substrate which is suitable for the following operations. The generation of the mirror layer is observed precisely by readings and interrupted, for example, at a thickness of 16 nanometers.

The so-called copying phase takes place immediately after the production of a nonstructured mirror layer on the glass substrate. For this, the mirror layer is coated with photo resist and, in the example selected, the micro mask for the dark blue portions of the original map (blue captions, depth lines in lakes and other symbols) is copied on the photo resist and developed. The unmasked silver layer areas now are removed again in the ionograph at reversed polarization, that is, with the use of the glass support as cathode. However, the silver layer below the areas protected by photo resist is preserved. Subsequently, the photo resist is removed with acetone or some similar solvent.

Next, the glass platelet is recoated with silver and, in an additional copying operation, the color micro mask for light blue (lakes and streams) is copied on and removed in the high frequency plasma as described above, and the photo resist is subsequently peeled off.

Now the glass substrate shows with precision all details of the finished pattern of the map which are to be reproduced in dark and light blue as a grainless silver layer. This layer is 32 nm thick at the locations where a dark blue color is to appear and at the locations where a light blue color is to be reproduced, the layer is 16 nm thick.

Now the entire glass platelet is covered with a spacer layer of vaporized clear glass with an optical thickness of 238 nm. When $M_gF_2$ is used, this corresponds to an actual thickness of 172 nm. A silver layer of 16 nm thickness is placed thereabove over the entire area, which, as in the copying phase described immediately above, is exposed with the micro mask for the light blue color and removed accordingly.

By varying the thickness of the spacer layer, 238 nm in the above example, any desired color hue from 13 to 24 according to DIN 6164 can be achieved. However, the color hues 1 to 12 according to this standard cannot be formed without problem. In fact, in spacer layers thicker than 210 nm additional interference minima move from the UV range into the visible range, thereby causing mixed colors. The production of the yellow-red color hues 1 to 12 according to the DIN standard 6164 thus is more complicated. For the color hues 13 to 24 any desired degree of saturation according to DIN 6164 can be adjusted by appropriate thickness of the silver layers.

The structure of the inorganic layers, as described above, is illustrated clearly in FIG. 1. In this Figure the reference symbols 1, 2 and 3 identify the silver layers applied in the three copying phases, while 4 identifies the transparent interference layer (spacer layer).

Figure 1:
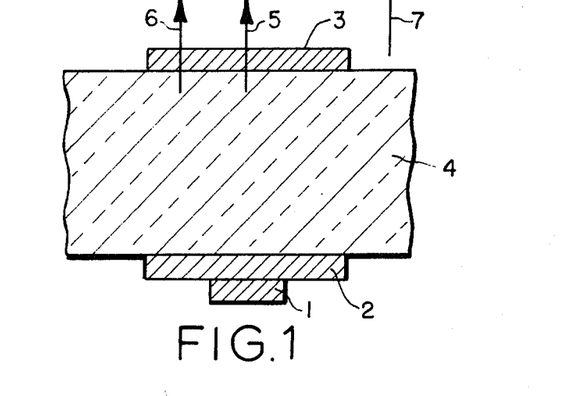
FIG. 1 is a transverse sectional view of a first embodiment of this invention.

In this application, silver layer 2 is 16 nm thick and cooperates with the spacer layer 4 and the silver layer 3 to form an interference filter which passes blue light. Silver layer 1 is also 16 nm thick. This thickness combines with the 16 nm thickness of layer 2 to produce a combined layer 32 nm thick which cooperates with the spacer layer 4 and the silver layer 3 to form an interference filter which passes blue light in increased intensity. The spacer layer 4 is located on the silver layer 2 in a thickness of 238 nm. The silver layer 3 itself again has a thickness of 16 nm.

As a result, the light exiting in the area of arrow 5 appears dark blue (color 17:8), the light exiting in the area of arrow 6 appears light blue (color 17:4), and the light exiting from other regions, for example, in the area of arrow 7, appears white (not vary-colored).

Figure 2:
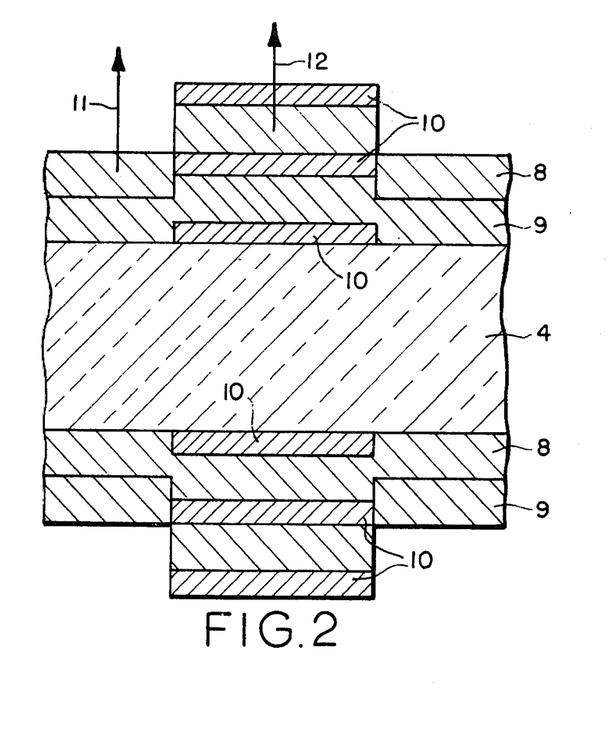
FIG. 2 is a transverse sectional view of a second embodiment of this invention.

FIG. 2 clearly illustrates that alternating layers of high and low refractory partial layers may be used as reflecting layers in place of silver layers. Again, it is assumed in FIG. 2 that the color blue is to be reproduced, and a spacer layer of corresponding thickness is provided. In contrast to the embodiment of FIG. 1, the low refractory partial layers 8 and 9 adjacent the interference layer are covered by high refractory partial layers 10 both against the interference layer as well as between each other and toward the exterior, as represented schematically on a highly enlarged scale in FIG. 2. As a result, in the area outside the alternating layers, for example in the area of arrow 11, white light (non-vary-colored) exits.

$MgF_2$, $SiO_2$, $ThF_4$, $SiO$ $Ta_2O_5$, $Fe_2O_3$ or other oxides, fluorides and/or sulfides are appropriate materials for the spacer layers (interference layers) for the method according to the invention. According to one advantageous embodiment of this invention, the spacer layer first is applied to a substrate surface provided with corresponding reflecting layers. This spacer layer is applied in a thick layer (approximately 10 times thicker than what is needed for the use of the individual colors), and subsequently removed under plasma-chemical modification to a thickness commensurate with the desired colors. In the finished recording medium, the thickness of the spacing layer determines the color hue, while the saturation is determined by the reflective capacity of the mirrors, as explained above in connection with FIG. 1.

It will be obvious to persons skilled in the art that the techniques described above may be used to record mixed colors by consecutively applying different color hues in superposition. Mixed colors may be used to form different colors in adjacent regions. In one region a mixed color is formed by superimposing two spacer layers of differing thicknesses separated by a reflecting layer. These two spacer layers are bounded by reflecting layers at the top and bottom, and a mixed color results. In an adjacent area, the same two spacer layers are deposited, but no reflecting layer is interposed between them, and accordingly, a single color is produced rather than a mixed color.

It also is possible to use the method of this invention to produce multicolored structures with fluorescent luminous colors, by using materials for the spacer layers which convert incoming UV light into visible luminous radiation and emit this visible light. $MgF_2$, $ZuS$ and similar materials may be appropriately used as materials for this operation.

Hard glass (zerodur and quartz glass) are particularly appropriate as substrates 20 and 20' for the microstructures to be applied. Such hard glass substrates can be reprojected at high light levels without requiring major expenditures for heat filtration. Ordinary color films would be charred by such reprojection within seconds.

A particularly advantageous embodiment of the method according to the invention is described below in the form of an example. Once again, it is assumed for reasons of better illustration that a micro map shall be produced in a diapositive on a glass substrate.

First, the glass substrate is covered with a thin layer of $Cd_S$, $Fe_2O_3$, $As_2S_3$, or a similar organic compound. Then the substrate is coated with photo resist and the the negative micro mask for the color blue is copied onto the photo resist. Subsequently the aforementioned organic compound layer is removed in the areas where the color blue will be reproduced down to the glass surface and then the photo resist is peeled off. Now the substrate again is clear glass in the area where the color blue will be reproduced and otherwise it is yellow-brown due to the inherent color of the thin $Fe_2O_3$ layer.

As a second step a blue layer combination is now applied as a silver layer in a positive micro mask "lakes, rivers and forests" in structurized form. That way all blue areas (lakes, streams) and green areas (forests) are present as structure of the map as regions in which a reflecting silver layer has been deposited. However, below the green areas (forests) there is the $Fe_2O_3$ layer (or another suitable layer), while below the blue areas (lakes) the substrate is clear glass. Thus, lakes and streams are blue (color hue 17), woods and similar areas, however, are green (hue 22) as a mixture of the yellow and blue colors. The other areas (fields, etc.) are yellow. Legends remain colorless (nonvary-colored) and transparent.

Thus, with two copy operations, namely, with a negative micro mask (lakes, streams) and a positive micro mask (lakes, streams and forests) altogether four colors are obtained: color hue 17 (blue), color hue 22 (green), color hue 2 (yellow), and color hue 0 (nonvary-colored). This demonstrates one embodiment of the invention.

Any additional and new color hue produced by another copy operation produces twice as many new colors by blending with the color hues already produced previously in a partial area of the pattern. Thus, ten individual copy operations produce $2^{10}$, or 1024 color hues with the technical application of a binary color code.

According to the four-color set of topology, two copy operations suffice completely, in theory, for producing any complex varying map structure. However, in practice the micro map is adjusted by adding still more colors to the conventional map, for example, red for main roads, and black for legends.

For example, the color red (8 according to DIN 6164) can be obtained in the following manner:

1. Reactive dust a substrate with Fe cathode for 10 minutes;
2. Copy the positive micro mask for main roads (red) onto the $FeO_3$;
3. Peel and remove ($Fe_2O_3$ with n=2.9, and a thickness of 45 nm remains on the red details as an interference layer);
4. Vaporize a spacer layer of $MgF_2$ with thickness 284 nm. (In cooperation with the $MgF_2$ spacer layers for green (forests) and blue (lakes) and the Ag mirror, this spacer layer produces the color hue red. Steps 5 to 20 complete the red recording and at the same time record forests and lakes in green and blue.);
5. Vaporize Ag to a thickness of 20 nm;
6. Perform a second copying step using a positive micromask for forests;
7. Remove and peel the photo lacquer for 2 minutes;
8. Vaporize $MgF_2$ to a thickness of 153 nm (T=22 green) and metallize Ag to a thickness of 20 nm;
9. Perform a third copying step using a positive micromask for forests and main roads;
10. Remove and peel off the photo lacquer for 2 minutes;
11. Vaporize an intermediate layer of $MgF_2$ to a thickness of 75 nm (interference color in UV);
12. Metallize Ag to a thickness of 16 nm;
13. Perform a fourth copying step using a positive micromask for depth lines (dark blue);
14. Remove and peel off photo lacquer;
15. Metallize Ag to a thickness of 16 nm;
16. Perform a fourth copying step using a positive micromask for lakes and rivers;
17. Remove and peel off photo lacquer;
18. Vaporize a $MgF_2$ interference layer (blue) and metallize Ag to a depth of 16 nm;
19. Perform a fifth copying step using a positive micromask for lakes, rivers, and roads;
20. Remove and peel off photo lacquer;
21. Vaporize protective layer;
22. Metallize chrome (Cr mask black);
23. Repeat step 6 using a positive micromask for black legends, buildup, etc;
24. Remove unprotected Cr layer;
25. Peel off photo lacquer;
26. Apply protective layer.

The invention has been explained on the basis of producing micro structures. However, the method according to the invention also is directly applicable to the multicolored representation of macroscopic symbols.

From original color maps (600×600 mm) on the scale of 1:50,000, micro maps were produced in a scale of 1:10,000,000 in a size of 3×3 mm. The total information content of a 1:50,000 map which contains a tremendous number of bits thus is accommodated on 9 mm². This means that a map of the Federal Republic of West Germany can be reproduced in the same scale ratio on a glass plate of 100×100 mm in micro representation, with all details of the map being represented with the precision of a map of 1:50,000.

Persons skilled in the art of photo lithography and high vacuum vaporization technique are sufficiently familiar with the individual steps of copying, removal and vaporization, so that in the present application these steps have not been described in detail. It should be understood that various changes and modifications to the preferred embodiments described herein will be apparent to those skilled in the art. Such changes and modifications can be made without departing from the scope of the present invention and without diminishing its attendant advantages. It is, therefore, intended that such changes and modifications be covered by the following claims.

I claim:

1. A method for producing a high resolution recording medium on a substrate, comprising the following steps:
   (a) applying at least one reflecting layer of an inorganic material to a surface of the substrate;
   (b) applying a photoresist material to the reflecting layer;
   (c) exposing a patterned portion of the photoresist material by means of an exposure mask;
   (d) developing the photoresist material;
   (e) removing at least a portion of the reflecting layer not covered with photoresist material;
   (f) removing the remaining photoresist material;
   (g) applying a substantially uniformly thick interference layer of a translucent inorganic material to the surface of the substrate and the remaining reflecting layer;
   (h) applying at least one additional reflecting layer of an inorganic material to the interference layer;
   (i) applying a photoresist material to the additional reflecting layer;
   (j) exposing a patterned portion of the photoresist material by means of an exposure mask;
   (k) developing the photoresist material;
   (l) removing the portion of the additional reflecting layer not covered with photoresist material; and
   (m) removing the remaining photoresist material.

2. The method of claim 1 wherein the at least one reflecting layer is formed of a metal.

3. The method of claim 1 wherein the at least one reflecting layer is formed of silver.

4. The method of claim 1 wherein the at least one reflecting layer is formed of a high refraction translucent material.

5. The method of claim 4 wherein the at least one reflecting layer is substantially free of absorption throughout the visible wavelength range.

6. The method of claim 1 further comprising the step of repeating at least steps (g)–(m) on the substrate to form a second patterned interference filter having a color hue different from the color hue of the interference filter formed by steps (a)–(m).

7. The method of claim 1 wherein the portion of the at least one reflecting layer remaining after step (f) includes a first zone and a second zone; the interference layer applied in step (g) is applied over both the first and second zones; the portion of the at least one additional reflecting layer remaining after step (m) covers only the first zone such that the interference layer, the at least one reflecting layer, and the at least one additional reflecting layer cooperate to form an interference filter in the first zone for a first color hue; and the method further includes the following steps:
   (n) applying an additional substantially uniformly thick interference layer of a translucent inorganic material to the interference layer and the remaining additional reflecting layer such that the additional interference layer extends over the first and second zones;

(o) applying at least one further reflecting layer over the additional interference layer in the region of the second zone only such that the at least one reflecting layer, the interference layer, the additional interference layer, and the at least one further reflecting layer cooperate to form an interference filter for a second color hue, distinct from the first color hue.

8. A method for producing a high resolution recording medium on a substrate, said method comprising the following steps:
   (a) applying at least one first reflecting layer of a high refraction, translucent, inorganic material to a surface of the substrate;
   (b) removing a patterned portion of the reflecting layer applied in the preceding step by first applying a photoresist material to the layer applied in the preceding step, then exposing a patterned portion of the photoresist material by means of an exposure mask, then developing the photoresist material, then removing at least a portion of the layer applied in the preceding step not covered with photoresist material, and then removing the remaining photoresist material;
   (c) applying at least one second reflecting layer of a low refraction, translucent, inorganic material to the surface of the substrate and the remaining first reflecting layer, and then repeating step (b) above to remove a patterned portion of the second reflecting layer;
   (d) applying at least one third reflecting layer of a high refraction, translucent, inorganic material to the surface of the substrate and the remaining second reflecting layer, and then repeating step (b) above to remove a patterned portion of the third reflecting layer such that at least a portion of the low refraction second reflecting layer is interposed between the high refraction first reflecting layer and the high refraction third reflecting layer;
   (e) applying a substantially uniformly thick interference layer of a translucent inorganic material to the surface of the substrate and the remaining reflecting layer;
   (f) applying at least one fourth reflecting layer of a high refraction, translucent, inorganic material to at least a portion of the interference layer;
   (g) removing a patterned portion of the reflecting layer applied in the preceding step by first applying a photoresist material to the layer applied in the preceding step, then exposing a patterned portion of the photoresist material by means of an exposure mask, then developing the photoresist material, then removing at least a portion of the layer applied in the preceding step not covered with photoresist material, and then removing the remaining photoresist material;
   (h) applying at least one fifth reflecting layer of a low refraction, translucent, inorganic material to at least a portion of the interference layer and the remaining fourth reflecting layer, and then repeating step (g) above to remove a patterned portion of the fifth reflecting layer; and
   (i) applying at least one sixth reflecting layer of a high refraction, translucent, inorganic material to at least a portion of the interference layer and the remaining fifth reflecting layer, and then repeating step (g) above to remove a patterned portion of the sixth reflecting layer such that at least a portion of the low refraction fifth reflecting layer is interposed between the high refraction fourth reflecting layer and the high refraction sixth reflecting layer.

9. The method of claim 8 wherein the first, second, third, fourth, fifth, and sixth reflecting layers are each substantially free of absorption throughout the visible wavelength range.

10. The method of claim 1 or 8 wherein the interference layer is substantially free of absorption throughout the visible wavelength range.

11. The method of claim 1 or 8 wherein the reflecting layers are applied by means of a sputter process.

12. The method of claim 1 or 8 wherein only a part of at least one of the plurality of reflecting layers not covered with photoresist material is removed such that, after removal of said part, said at least one reflecting layer has a first thickness in a first region and a second thickness, different from the first thickness, in a second region.

13. The method of claim 1 or 8 wherein the entire portion of one of the plurality of reflecting layers not covered with photoresist material is removed.

14. The method of claim 1 or 8 wherein at least one of the reflecting layers is removed at a rate of about 10 nanometers per minute.

15. The method of claim 1 or 8 wherein the photoresist is soluble in an organic solvent and remains soluble after removal of the respective reflecting layer.

16. The method of claim 1 or 8 wherein the interference layer is vaporized over the entire surface of the substrate and the reflecting and interference layers form a patterned interference filter in which the thickness of the interference layer determines the color hue of the filter and the reflectivity of the reflecting layers determines the color saturation of the filter.

17. The method of claim 16 wherein the interference layer comprises a material selected from the group consisting of translucent inorganic oxides, fluorides and sulfides.

18. The method of claim 16 wherein the interference layer consists essentially of a material selected from the group consisting of $MgF_2$, $SiO_2$, ThF, SIO, $Ta_2O_5$, and $Fe_2O_3$.

19. The method of claim 8 further comprising the step of repeating at least steps (e)–(i) on the substrate to form a second patterned interference filter having a color hue different from the color hue of the interference filter formed by steps (a)–(i).

20. The method of claim 8 wherein the portion of the first, second, and third reflecting layers remaining after step (d) includes a first zone and a second zone; the interference layer applied in step (e) is applied over both the first and second zones; the portion of the fourth, fifth, and sixth reflecting layers remaining after step (i) covers only the first zone such that the first, second, and third reflecting layers, the interference layer and the fourth, fifth, and sixth reflecting layers cooperate to form an interference filter in the first zone for a first color hue; and the method further includes the following steps:
   (j) applying an additional substantially uniformly thick interference layer of a translucent inorganic material to the interference layer and the remaining portions of the sixth reflecting layer such that the additional interference layer extends over the first and second zones;
   (k) applying at least one further reflecting layer over the additional interference layer in the region of the second zone only such that the first, second, and third reflecting layers, the interference layer, the additional interference layer, and the at least one further reflecting layer cooperate to form an interference filter in the second zone for a second color hue, distinct from the first color hue.

21. The method of claim 1 or 8 further including the following additional step:

forming at least one patterned interference filter over the interference filter formed by the preceding steps such that a combined color hue is generated by the two interference filters by multiplicative mixing.

22. The method of claim 1 or 8 wherein the substrate is transparent.

23. The method of claim 1 or 8 wherein the substrate is glass.

24. The method of claim 1 or 8 wherein the substrate is quartz.

25. The method of claim 1 or 8 wherein the substrate is opaque and the substrate surface is reflecting.

26. The method of claim 1 or 8 wherein the interference layer is formed of a fluorescent material.

27. The method of claim 1 or 8 wherein the interference layer is formed of a fluorescent material chosen from the group consisting of $MgF_2$ and $ZnS$.

* * * * *

UNITED STATES PATENT AND TRADEMARK OFFICE
CERTIFICATE OF CORRECTION

Page 1 of 3

PATENT NO. : 4,258,126
DATED : March 24, 1981
INVENTOR(S) : Leopold Hiesinger

Figure 3:
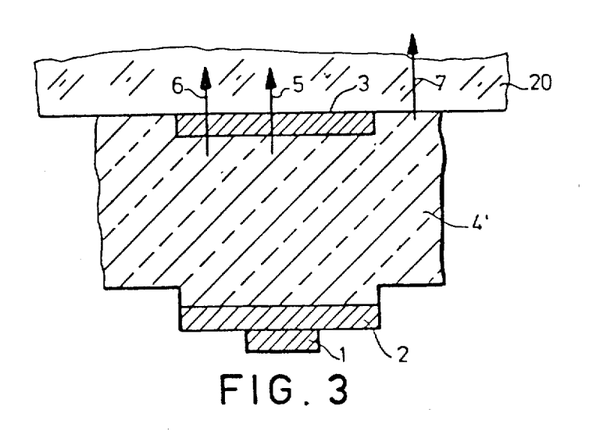
FIG. 3 is a transverse sectional view of the embodiment of FIG. 1 showing the actual arrangement of the various layers of the embodiment on a substrate.

It is certified that error appears in the above—identified patent and that said Letters Patent is hereby corrected as shown below:

Add Figure 3

FIG. 3

UNITED STATES PATENT AND TRADEMARK OFFICE
CERTIFICATE OF CORRECTION

PATENT NO. : 4,258,126

DATED : March 24, 1981

INVENTOR(S) : Leopold Hiesinger

Figure 4:
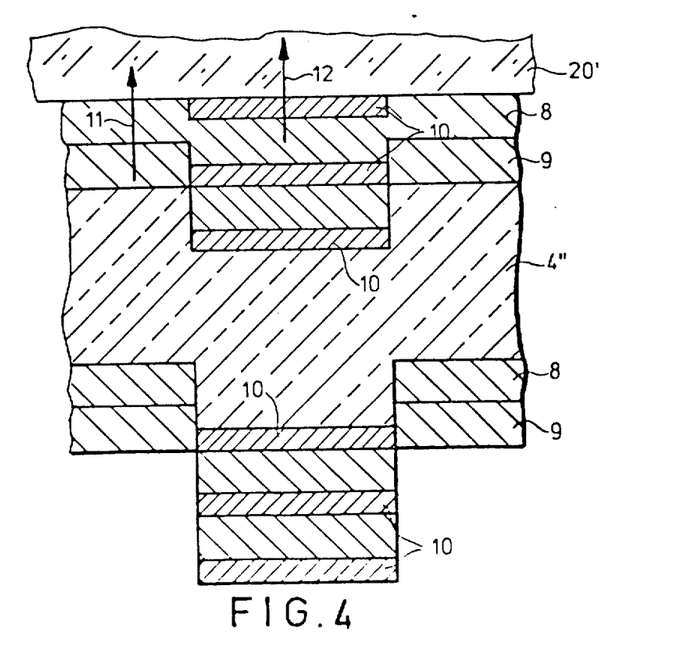
FIG. 4 is a transverse sectional view of the embodiment of FIG. 2 showing the various layers of the embodiment as arranged on a substrate.

It is certified that error appears in the above—identified patent and that said Letters Patent is hereby corrected as shown below:

Add Figure 4

FIG. 4

UNITED STATES PATENT AND TRADEMARK OFFICE
CERTIFICATE OF CORRECTION

PATENT NO. : 4,258,126  
DATED : March 24, 1981  
INVENTOR(S) : Leopold Hiesinger Page 3 of 3

It is certified that error appears in the above—identified patent and that said Letters Patent is hereby corrected as shown below:

Column 4, line 59, delete "$MgF_2$" (with italicized "g") and insert therefore --$MgF_2$-- (without italicized "g").

Column 6, line 25, delete "$Cd_S$" (with italicized "s") and insert therefore --$CdS$-- (without italicized "s").

Signed and Sealed this

Fifteenth Day of September 1981

[SEAL]

*Attest:*

GERALD J. MOSSINGHOFF

*Attesting Officer*     *Commissioner of Patents and Trademarks*